United States Patent [19]

Inamori et al.

[11] 4,374,316

[45] Feb. 15, 1983

[54] SEMICONDUCTOR INTEGRATED CIRCUIT SUPPORTER HAVING A HEATING ELEMENT

[75] Inventors: Kazuo Inamori, Kyoto; Kiyoshige Miyawaki, Kagoshima, both of Japan

[73] Assignee: Kyoto Ceramic Co., Ltd., Japan

[21] Appl. No.: 181,379

[22] Filed: Aug. 22, 1980

[30] Foreign Application Priority Data

Aug. 29, 1979 [JP] Japan .................. 54-110904

[51] Int. Cl.³ .................................... H05B 1/00
[52] U.S. Cl. .................. 219/209; 219/210; 219/530; 219/544; 219/552; 338/22 SD
[58] Field of Search .............. 219/209, 210, 462, 464, 219/501, 504, 505, 530, 540, 543, 439, 541, 544, 552, 553; 338/22 R, 22 SD, 308, 309

[56] References Cited

U.S. PATENT DOCUMENTS

| | | | |
|---|---|---|---|
| 3,450,863 | 6/1969 | Scholl | 219/501 |
| 3,887,785 | 6/1975 | Ahlport | 219/209 |
| 3,947,658 | 3/1976 | Sato | 219/504 |
| 4,035,613 | 7/1977 | Sagawa | 219/552 |

Primary Examiner—Volodymyr Y. Mayewsky
Attorney, Agent, or Firm—Spensley, Horn, Jubas & Lubitz

[57] ABSTRACT

A semiconductor integrated circuit supporter on which a heating element is dielectrically provided, said supporter comprising a package, printed circuit board, mother board, etc. for supporting a semiconductor integrated circuit which includes devices such as transistors.

The heating element provided on said semiconductor integrated circuit supporter is capable of heating the whole or a required part only thereof so that the semiconductor integrated circuit is preheated to a temperature required for its normal operation with precision and stability thereby improving the accuracy and reliability of various devices of which a semiconductor integrated circuit is composed as well as the control by said devices.

10 Claims, 8 Drawing Figures

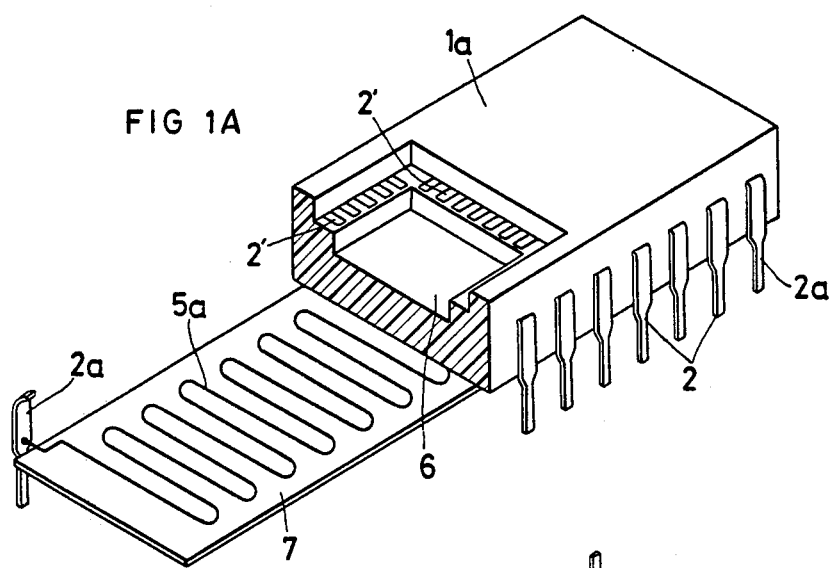
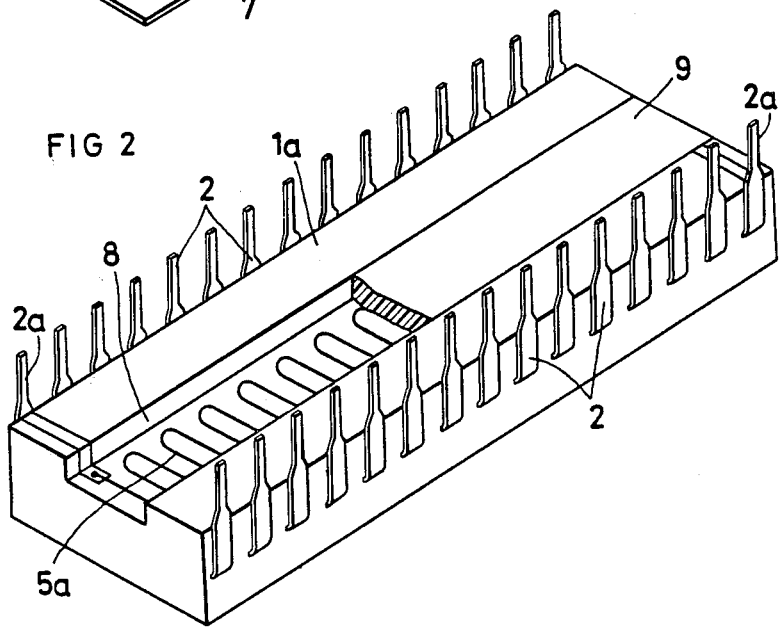

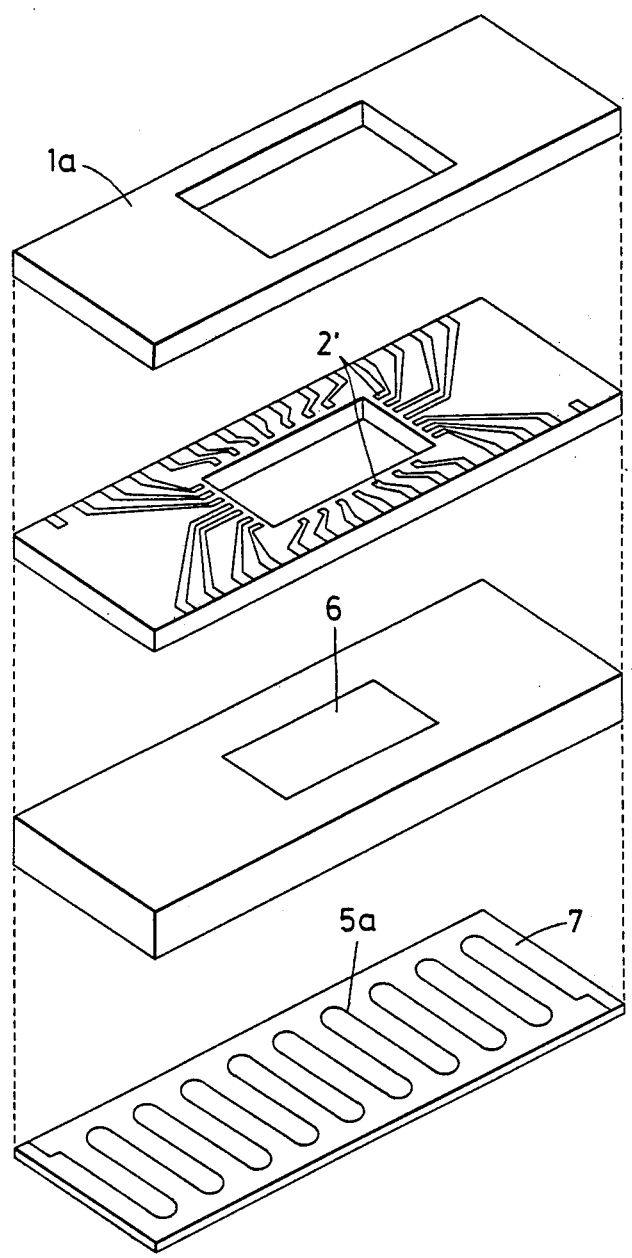

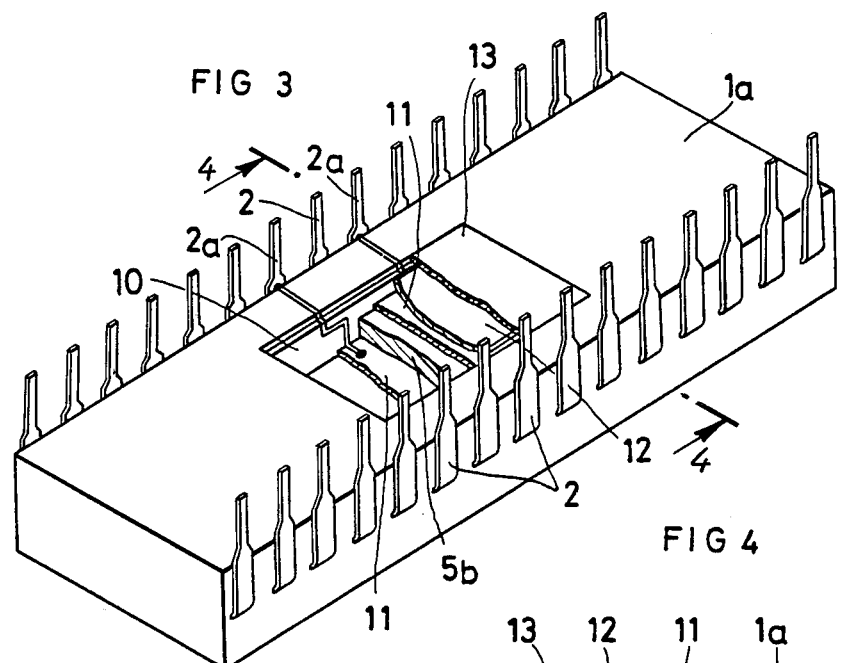
FIG 3
FIG 4
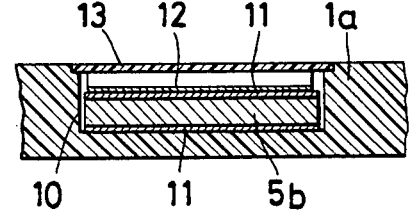
FIG 6
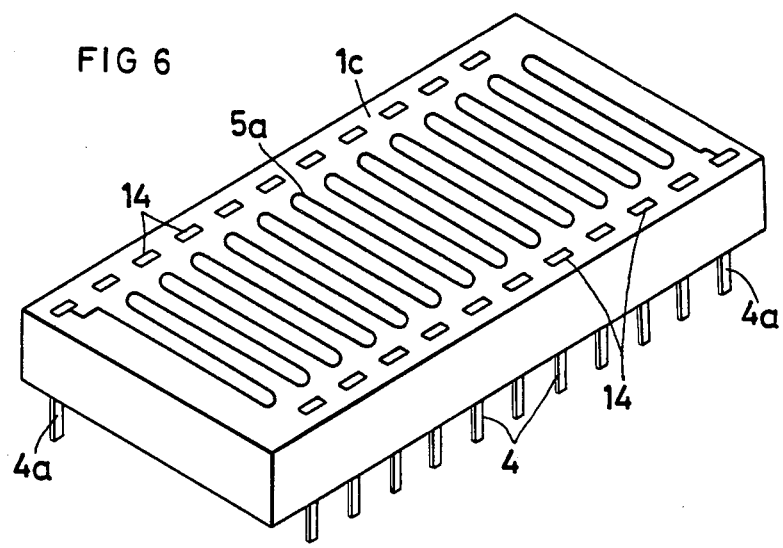

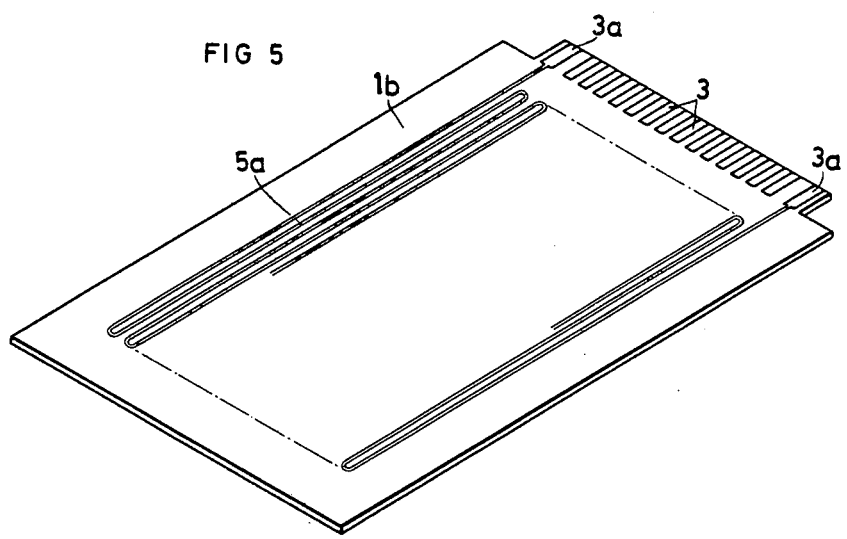
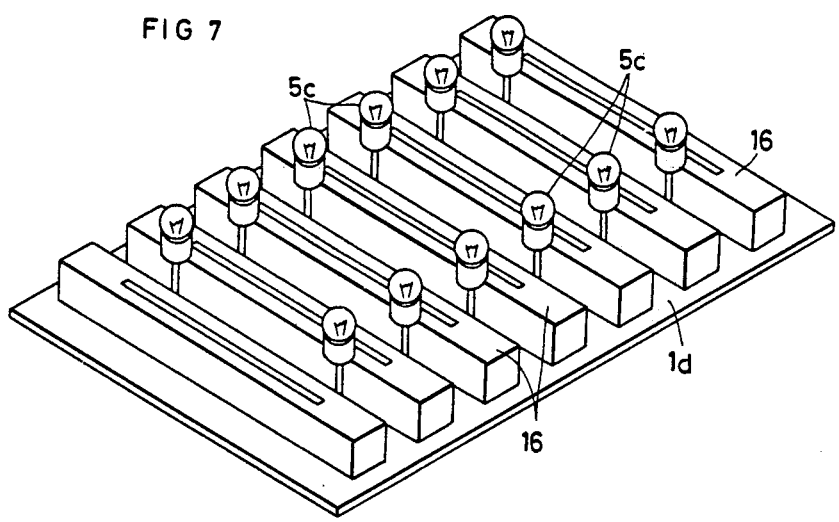

SEMICONDUCTOR INTEGRATED CIRCUIT SUPPORTER HAVING A HEATING ELEMENT

The present invention relates to a supporter of a semiconductor integrated circuit which includes devices such as transistors, and is provided with a heating element dielectrically on the circuit.

Generally, integrated circuits are used in such devices as calculating machines, measuring machines and various controlling apparatuses. They are highly valuable for their low cost, high reliability and small dimensions.

In designing integrated circuits, particular consideration is given to the radiation characteristics thereof since they are self-heated by a thermal loss of part of the current until their operation becomes unstable due to abnormal temperature elevation. On the other hand, practically no consideration has been given in connection to low temperatures. For example, when the operation temperature range of semiconductor integrated circuit is expected to be −55° to 75° C. or −55° to 100° C., fins, for example, are attached to the semiconductor integrated circuit in order to increase the radiation efficiency, while the lower limit of the temperature range was disregarded. However, at a low temperature adjacent the lower limit of the temperature range, there are not many semiconductor integrated circuits that are capable of maintaining their normal function. Particularly in the neighborhood of the polar regions or on high mountains, it is not infrequent that the atmospheric temperature falls below −55° C. At such a low temperature, for example, the semiconductor integrated circuit starter mounted on a motorcar is frequently deprived of its precision and stability. It is necessary, therefore, that a countermeasure be taken to cope with low temperatures in order to heighten the reliability of the operation of the starter.

The present invention provides an apparatus capable of coping with the aforementioned low temperatures. To be more precise, the invention relates to an apparatus wherein a heating element is dielectrically provided on a supporter. Such a supporter may be a package, printed circuit board, mother board, etc. for supporting a semiconductor integrated circuit in a broad sense including transistors thereby enabling the semiconductor integrated circuit to be heated to a temperature at which it can normally operate with stability.

The invention has for an object to improve the precision and reliability of various apparatuses in which integrated circuits are incorporated as well as the control by such apparatuses by preheating the integrated circuit to a required temperature through direct or indirect heating of the whole or a required part of the supporter thereof.

The aforesaid and other objects are accomplished by the improvements and combinations of the parts comprising the invention, preferred embodiments of which are shown by way of examples in the accompanying drawings and herein described in detail.

FIG. 1-A is a perspective view, broken away in part, showing a package which is a supporter of semiconductor integrated circuit.

FIG. 1-B is an exploded perspective view of the package shown in FIG. 1-A, without the pins 2.

FIG. 2 shows another embodiment in which the reverse face of a package is illustrated in perspective with a lid plate broken away in part.

FIG. 3 is a perspective view of the reverse face of a package, broken away in part, in which a thermistor is used as a heating unit.

FIG. 4 is a sectional view taken along the line 4—4 of FIG. 3.

FIG. 5 is a perspective view of the reverse face of a printed circuit board for use as a supporter of semiconductor integrated circuit.

FIG. 6 is a perspective view of a socket member of a package for supporting semiconductor integrated circuit.

FIG. 7 is a perspective view of a mother board for use as a supporter of a semiconductor integrated circuit.

According to the present invention, semiconductor integrated circuit (hereinafter referred to as integrated circuit) signifies a congregation of elements including p-n junctions and broadly comprising transistors, integrated circuits, large scale integrated circuits, etc., while the integrated circuit supporter generically comprises a package for supporting such an integrated circuit, a printed circuit board on which integrated circuit is mounted, a package or print substrate socket, or a mother board provided with an array of connectors for supporting a plurality of printed circuit boards or packages.

FIG. 1-A shows an embodiment of an integrated circuit supporter wherein a package body 1a consisting of insulating material, such as ceramics, resin, etc., is provided on its surface with a recess 6 for housing the integrated circuit therein. Terminals 2' electrically connected to lead pins 2 arranged on the lateral sides of the body 1a are disposed on the shoulder of the recess 6 so that they are connected to the terminals of the integrated circuit respectively.

To the reverse face of the body 1a is secured a heating element 5a consisting of a metal resistance wire, such as a nichrome wire, iron-chromium wire, etc., arranged in a continuous curve on an insulation sheet 7 made of ceramics, mica or the like, both ends of the heating element 5a being connected to power supply pins 2a, 2a supported by the body 1a. In FIG. 1-B, the portions of the package body 1a are shown in an exploded view above the heat resisting insulation sheet 7. When package body 1a is used with an integrated circuit, the integrated circuit is placed on the bottom of the recess 6. When ceramics is used for the package body 1a and heat-resisting insulation sheet 7, a pattern of the heating element 5a is printed on a green sheet 7 of ceramics with tungsten powder ink, molybdenum powder ink, or ink principally comprising tungsten or molybdenum powder with other metal powders added thereto. The printed green sheet of ceramics is disposed under the package body 1a in such manner that the printed surface is interposed between the body 1a and the ceramic sheet, the ceramic body 1a and the ceramic sheet 7 being integrally bonded together by sintering thereby simultaneously metallizing the printed ink. Since the printed pattern of the heating element 5a is insulated between the ceramic body 1a and the ceramic sheet 7 which are integrally sintered together, not only is the production simplified but also the package thus obtained is greatly reduced in size.

The package body 1a is heated by the heating element 5a with the power supply pins 2a, 2a connected to the predetermined power source, whereby the integrated circuit housed in the recess 6 of the body 1a is preheated. Since the bottom of the recess 6 housing the integrated circuit has a smaller thickness than that of the body 1a, the integrated circuit is disposed near the heating element 5a. Thus the integrated circuit is not only preheated quickly but also perfectly insulated from the heating element 5a.

FIG. 2 shows an embodiment wherein the heating element 5a consisting of a metal resistance wire is disposed only under the desired portion of the package body 1a containing the integrated circuit instead of the whole of the reverse face thereof. A groove 8 is formed longitudinally on the reverse face of the body 1a. A heating element 5a is disposed in the groove 8. A lid 9 is then fitted into the groove 8, both ends of the heating element 5a being connected to the power supply pins 2a, 2a as in FIG. 1-A.

Thus the heating element heats exclusively the portion coinciding with the width of the integrated circuit housed in the recess 6 shown in FIG. 1-A instead of heating the whole of the package body 1a.

In the embodiment shown in FIG. 2, the heating element 5a extends over the whole length of the package body 1a. Needless to mention, however, the heating element 5a can also be arranged so that only the desired part of the longitudinal portion is heated.

When ceramics is used for the package body 1a and the lid 9, the pattern of the heating element 5a is printed on the ceramic lid 7 with tungsten powder ink, molybdenum powder ink, or ink principally comprising tungsten or molybdenum powder with other metal powders added thereto. The lid 7 thus printed is fitted into the groove 8. The body 1a and the lid 9 are integrated by sintering, while the ink of the heating element 5a is simultaneously metallized as in the case of the embodiment shown in FIG. 1-A.

The embodiment shown in FIG. 2 has an advantage in that the required part only can be locally heated either in the case of a single integrated circuit or a plurality of integrated circuits.

When a temperature at which the integrated circuit can operate the precision and stability is reached, heating is no longer necessitated. The heating temperature is controllable by providing a thermostat or the like, and this is also applicable to the embodiment of FIG. 1.

In the embodiment shown in FIGS. 3 and 4, a recess 10 is provided on the reverse face of the package body 1a as in FIGS. 1 and 2. A thermistor 5b is interposed between electrodes 11, 11 which are connected to power supply pins 2a, 2a provided on the lateral side of the body 1a and are housed in the recess 10. A lid 13 is applied with the interposition of a plate spring 12. Power is supplied to the thermistor 5b so that the package body 1a is heated by the heat developed by the thermistor 5b. The thermistor 5b is here utilized as a heater rather than a temperature detector.

The thermistor 5b may be either of the positive characteristic type or the negative characteristic type. The positive characteristic thermistor is preferable for the following reason. Its resistance is increased in conformity with the temperature elevation under a constant voltage until a predetermined balancing temperature is maintained. It is quickly heated by the initial supply of a heavy current, while the heating current is controlled after the temperature is elevated. Since the balancing temperature depends on the size and shape of the package 1a and the characteristics of the thermistor 5b, the heating voltage and other factors should be adequately selected so that they are within the temperature range of satisfactory operation of the integrated circuit.

According to this system, the thermistor 5b can be provided in plurality. This system has an advantage in that the required part only can be locally heated by adequately selecting the size and the number of the thermistor 5b.

The negative characteristic thermistor may be used with the benefit that the heating temperature can be predetermined. The negative characteristic thermistor reduces its resistance in conformity with the temperature elevation. If a constant voltage device is provided in the heating circuit so that a constant current is supplied, the potential difference between the electrodes 11, 11 on both sides of the thermistor is reduced when the temperature is elevated and the resistance is reduced, the Joules heat heating the thermistor being also reduced in order until the balancing temperature is reached. The negative characteristic thermistor, however, is relatively troublesome compared with the positive characteristic thermistor in respect that a constant voltage device is required.

The foregoing are embodiments for preheating the integrated circuit by heating the package. The other features of the supporter will now be described in detail.

FIG. 5 shows an embodiment wherein a printed circuit board is used as a supporter of the integrated circuit. On the printed circuit board 1b there is formed a circuit by a known process such as photo-etching. The required parts and the integrated circuit are mounted on the board 1b, a required number of lead wire connecting terminals 3 being provided on one side of the board 1b. On the reverse face of the board 1b there is formed a heating element 5a consisting of a metal resistance wire by means of photo-etching or any other known process, both ends of the heating element being connected to power supply terminals 3a, 3a provided on one side of the board 1b. The heating element 5a is heated by supplying a current thereto so as to heat the board 1b and preheat the integrated circuit mounted thereon as in the embodiments described hereinbefore.

The printed circuit board 1b has on its surface printed wiring, electronic parts, integrated circuit, small holes through which to extend the lead wires of said mounted parts, welding lands and the like. Therefore, the heating element 5a should be provided so as not to interfere with said wirings, parts and the lead wires thereof extending beyond the reverse face of the board. In spite of such difficulties in connection to the designing, this embodiment is relatively easy to practice as compared to the complicated procedure of providing a heating element for each of the transistors, etc., mounted on the board, since this embodiment enables one to preheat the whole of the integrated circuit en bloc.

When ceramics is used for the board 1b, the pattern of the heating element 5a is printed on the green plate of ceramics with tungsten powder ink, molybdenum powder ink, or ink principally comprising tungsten or molybdenum powder with other metal powders added thereto, the wirings on the surface of the board being also printed with ink of conductive metal powders. The board is sintered thereby simultaneously metallizing the printed wirings and the pattern of the heating element.

FIG. 6 shows a system of heating a socket member 1c which is used with the integrated circuit package of the embodiments of FIGS. 1 to 3, the socket member 1c being provided with a plurality of receiving holes 14 for receiving a plurality of lead pins 2 of the packages as shown in FIGS. 1 and 2. A plurality of lead terminals 4 are provided on one side of the socket member 1c, said lead terminals 4 being adapted to be electrically connected to the lead pins 2 of the package fitted into the receiving holes 14, respectively.

On the surface of the socket member 1c, there is disposed a heating element 5a similar to those of the embodiments of FIGS. 1 and 2, the heating element 5a being connected at both ends thereof to power supply pins 4a, 4a on both sides of the socket. The heating element 5a is insulated by coating its surface with a melted glass layer or a heat-resisting insulation layer of plastics, ceramics, etc., as desired. The lead pins 2 of the package are fitted into the receiving holes 14 of the socket member 1c, the power supply pins 4a, 4a being connected to the power source to heat the heating element 5a, whereby the package is heated and the integrated circuit is preheated.

This embodiment has an advantage in that the conventional package is utilizable as it stands, and the replacement of the package is very simple.

In addition, this embodiment is utilizable also as a board of a hybrid integrated circuit as is easily understandable by those skilled in the art.

FIG. 7 shows a still further embodiment wherein a multiplicity of connectors 16 are connected by lead wire connecting terminals 3 when printed circuit boards as shown in FIG. 5 are inserted into said connectors 16 and are secured in an array to a mother board 1d. Each of the connectors 16 is connected with each other by printed wiring formed on the reverse face of the mother board 1d.

A predetermined number of midget lamps 5c are lighted between the connectors 16 respectively. The integrated circuits mounted on the printed circuit board 1b inserted into and supported by the connectors 16 are thus heated by the radiation of the midget lamps and the convection of the heated air.

The same effect is obtainable by replacing the midget lamps with heaters comprising heating units interposed between insulation plates, for example, mica, respectively.

This embodiment, though its thermal efficiency is not satisfactory, has an advantage in that not only the conventional printed circuit boards can be used as they stand but also midget lamps and heating units can be fixed to the conventional mother board with simplicity.

What is claimed is:

1. A semiconductor integrated circuit supporter comprising:
   a body comprising a thermally conductive, electrically non-conductive material, said body being configured to support an integrated circuit on a first flat surface thereof;
   a cavity disposed within said body and said first flat surface configured to support an integrated circuit is located within said cavity;
   a flat heating element disposed on a second flat surface of said body, said second flat surface being in an overlapping spaced-apart relationship with said first surface; and
   means for joining said flat heating element to a source of energy such that said flat heating element, when activated, conducts heat to said first surface of said body.

2. A semiconductor integrated circuit supporter according to claim 1 wherein the semiconductor integrated circuit supporter is a package.

3. A semiconductor integrated circuit supporter according to claim 1 wherein the semiconductor integrated circuit supporter is a printed circuit board.

4. A semiconductor integrated circuit supporter having a heating element according to claim 1 wherein the semiconductor integrated circuit supporter is a socket member for a package.

5. A semiconductor integrated circuit supporter according to claim 1 wherein said heating element comprises a metal resistance wire.

6. A semiconductor integrated circuit supporter according to claim 1 wherein said heating element is a positive characteristic thermistor.

7. A semiconductor integrated circuit supporter according to claim 1 wherein said heating element comprises a pattern printed by one of the group consisting of tungsten powder ink, molybdenum powder ink, and ink principally comprising tungsten or molybdenum powder with other metal powders added thereto, said pattern being metalized.

8. A semiconductor integrated circuit supporter according to claim 7 wherein said material is ceramic.

9. A semiconductor integrated circuit supporter according to claim 8 wherein said supporter is manufactured by:
   printing said metal powder ink on a green ceramic sheet in a predetermined pattern;
   laminating said green ceramic sheet to said body; and
   sintering the entire supporter, thereby metallizing the printed pattern.

10. A semiconductor integrated circuit supporter comprising:
    a substrate composed mainly of a thermally conductive, electrically non-conductive material;
    a cavity disposed within said substrate configured to support an integrated circuit on a first surface thereof;
    a heating element disposed on a second surface of said substrate in a spaced-apart relationship with said first surface; and
    means for conducting electricity to said heating element.

* * * * *